(12) United States Patent
Kim et al.

(10) Patent No.: US 11,393,698 B2
(45) Date of Patent: Jul. 19, 2022

(54) MASK DESIGN FOR IMPROVED ATTACH POSITION

(71) Applicant: STATS ChipPAC Pte. Ltd., Singapore (SG)

(72) Inventors: ChangOh Kim, Incheon (KR); KyoungHee Park, Seoul (KR); JinHee Jung, Incheon (KR); OMin Kwon, Gyeonggi-do (KR); JiWon Lee, Seoul (KR); YuJeong Jang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/127,079

(22) Filed: Dec. 18, 2020

(65) Prior Publication Data
US 2022/0199423 A1  Jun. 23, 2022

(51) Int. Cl.
| | | |
|---|---|---|
| *H01L 21/48* | (2006.01) | |
| *H01L 23/31* | (2006.01) | |
| *H01L 23/498* | (2006.01) | |
| *H01L 23/552* | (2006.01) | |
| *H01L 21/683* | (2006.01) | |
| *H01L 23/544* | (2006.01) | |

(52) U.S. Cl.
CPC ...... *H01L 21/4814* (2013.01); *H01L 21/6835* (2013.01); *H01L 23/3121* (2013.01); *H01L 23/49822* (2013.01); *H01L 23/49838* (2013.01); *H01L 23/544* (2013.01); *H01L 23/552* (2013.01); *H01L 2221/6835* (2013.01); *H01L 2221/68322* (2013.01); *H01L 2223/54413* (2013.01)

(58) Field of Classification Search
CPC ............. H01L 21/4814; H01L 21/6835; H01L 23/3121; H01L 23/49822; H01L 23/49838; H01L 23/544; H01L 23/552; H01L 2221/68322; H01L 2221/6835; H01L 2223/54413
USPC ...................................................... 438/124
See application file for complete search history.

(56) References Cited

U.S. PATENT DOCUMENTS

| | | | |
|---|---|---|---|
| 7,977,173 B2 * | 7/2011 | Heitzinger | .......... H01L 27/1292 438/151 |
| 9,332,646 B2 | 5/2016 | Chen et al. | |
| 2013/0037923 A1 | 2/2013 | Yoo | |
| 2017/0077039 A1 * | 3/2017 | Liao | ....................... H01L 23/552 |
| 2020/0075502 A1 | 3/2020 | Kim et al. | |

* cited by examiner

*Primary Examiner* — Vu A Vu
(74) *Attorney, Agent, or Firm* — Brian M. Kaufman; Robert D. Atkins; Patent Law Group: Atkins and Associates, P.C.

(57) ABSTRACT

A semiconductor device has a semiconductor package including a substrate with a land grid array. A component is disposed over the substrate. An encapsulant is deposited over the component. The land grid array remains outside the encapsulant. A metal mask having a fiducial marker is disposed over the land grid array. A shielding layer is formed over the semiconductor package. The metal mask is removed after forming the shielding layer.

22 Claims, 14 Drawing Sheets

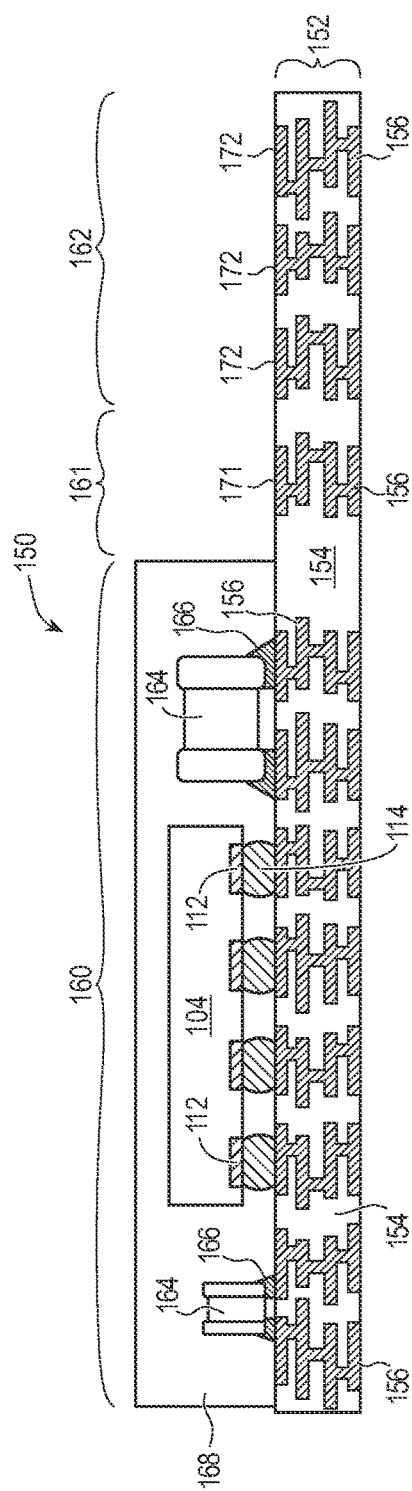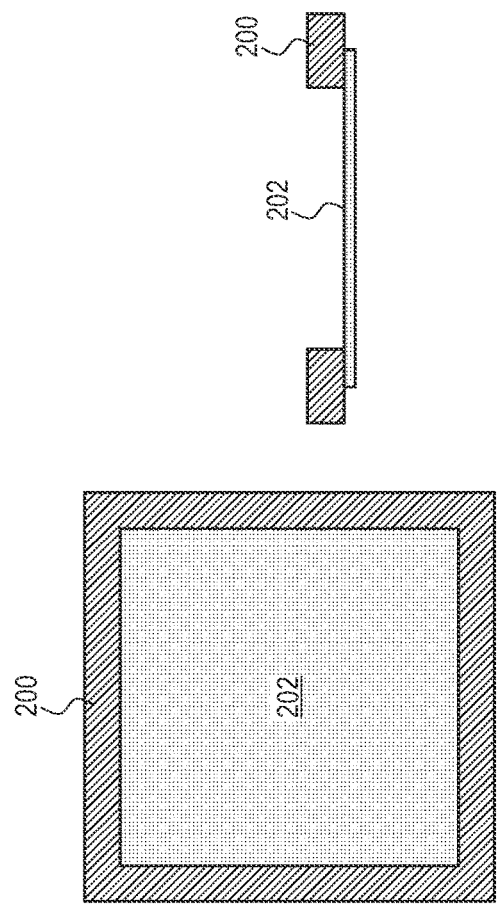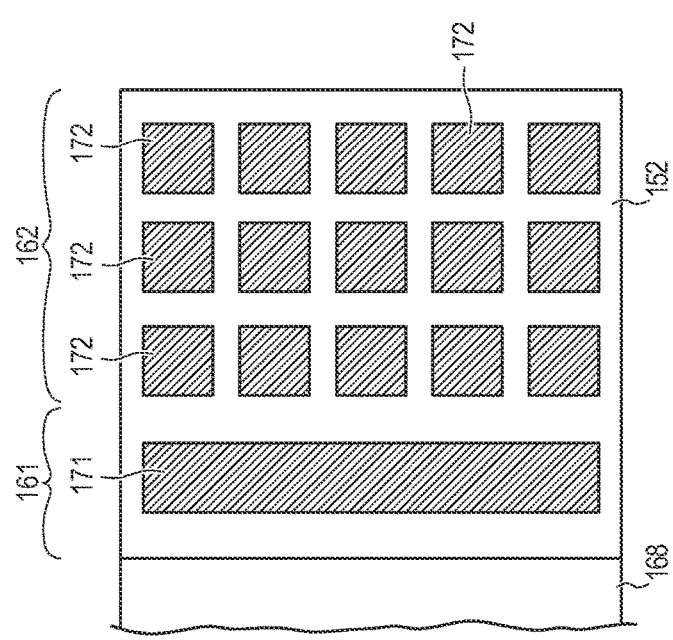

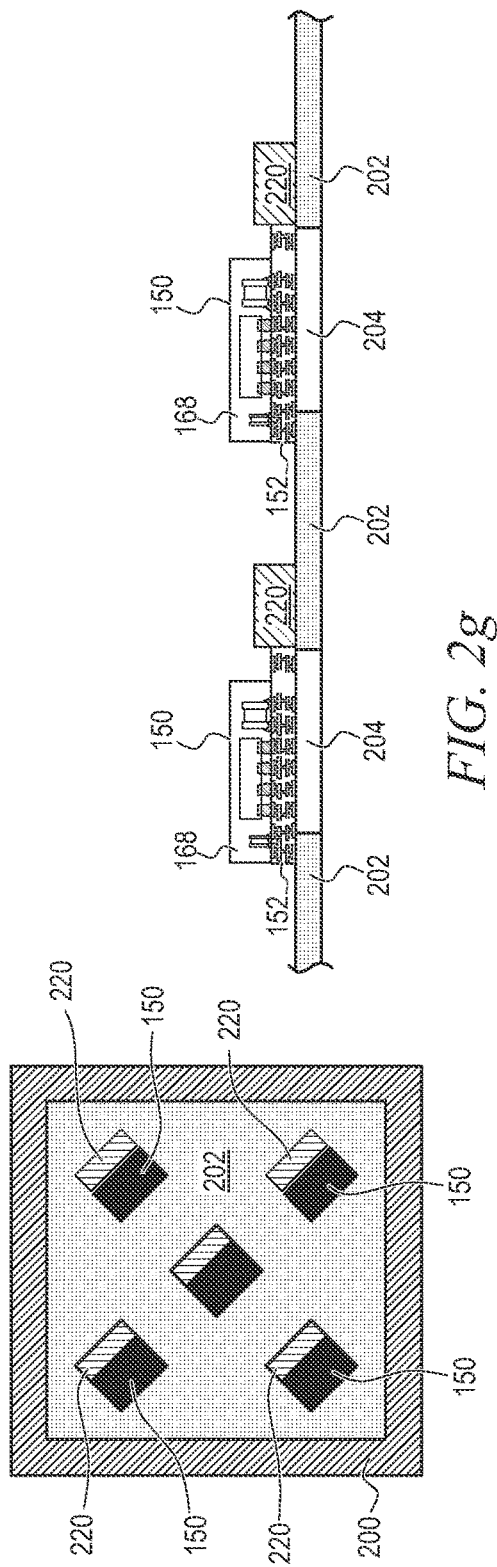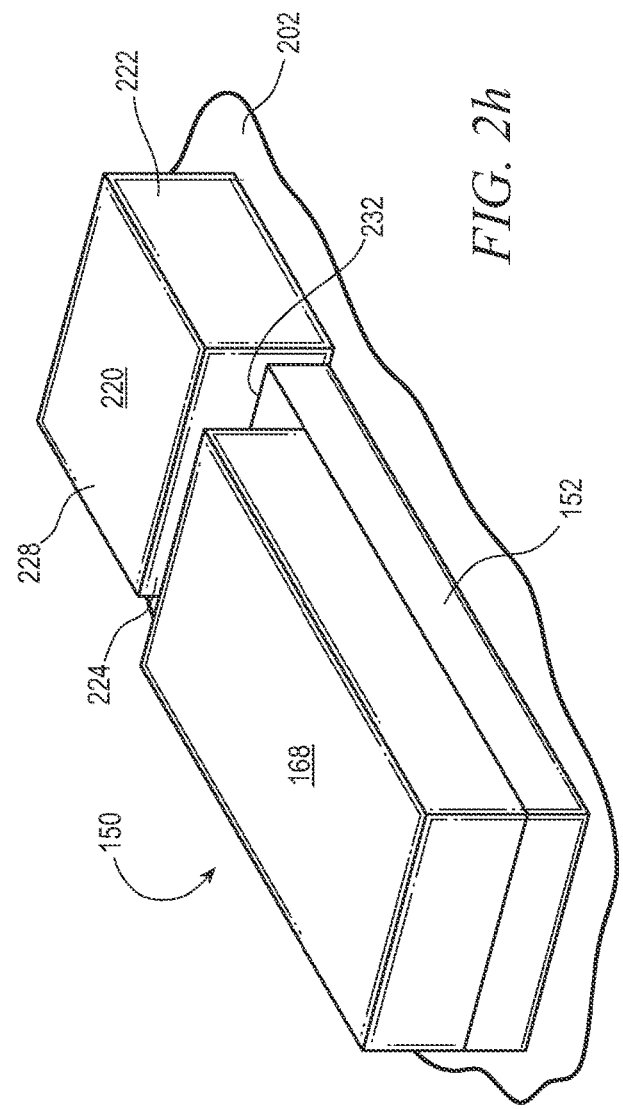

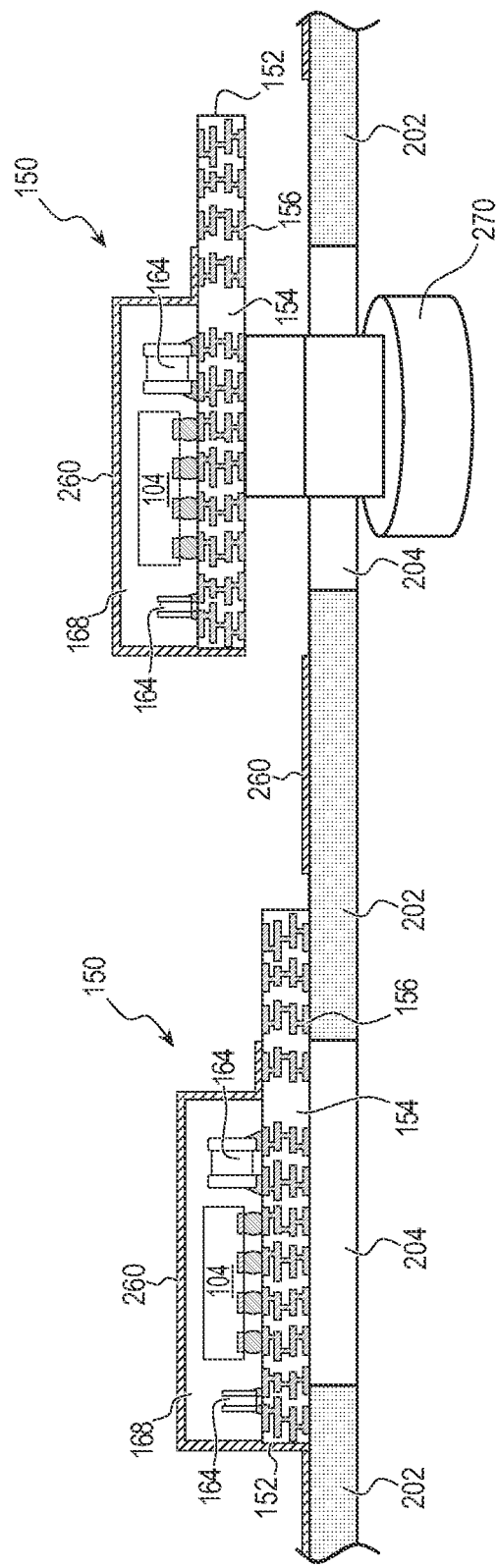
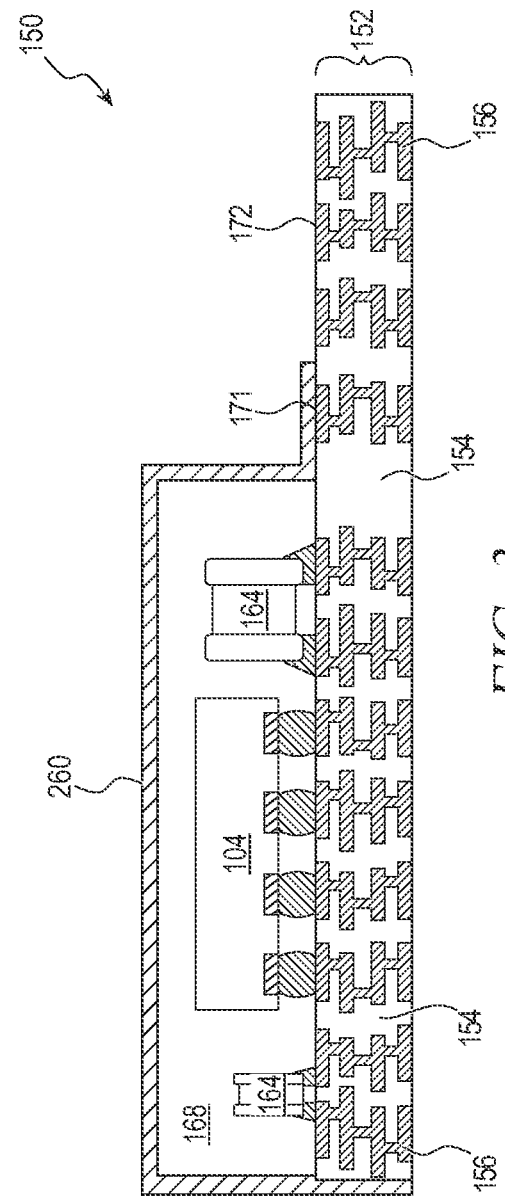
FIG. 2m
FIG. 3

MASK DESIGN FOR IMPROVED ATTACH POSITION

FIELD OF THE INVENTION

The present invention relates in general to semiconductor manufacturing and, more particularly, to a semiconductor device and method for forming selective electromagnetic interference (EMI) using a mask designed for improved attach positioning.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals can hit semiconductor die and discrete components within the package, which might otherwise malfunction. Shielding layers are also formed over packages with components that are expected to generate EMI to protect nearby devices.

One problem with prior art methods of semiconductor package shielding is that forming the shielding layer over a package completely covers the top of the package. Many semiconductor packages need open areas with exposed sockets or terminals that allow connection to adjacent semiconductor devices, or need to have some components outside of the shielding layer to perform their proper function.

Unfortunately, traditional shielding completely covers the packages and would short circuit any exposed terminals, sockets, or other exposed components. Tape masks have been used to form partially shielded packages. However, tape masks have complex process requirements to laminate the mask and then peel the mask after sputtering. Therefore, a need exists for semiconductor devices with selectively formed EMI shielding.

BRIEF DESCRIPTION OF THE DRAWINGS

FIGS. 2a-2m illustrate selectively forming a shielding layer using a preformed mask;

FIG. 3 illustrates a semiconductor device with the selectively formed shielding layer;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
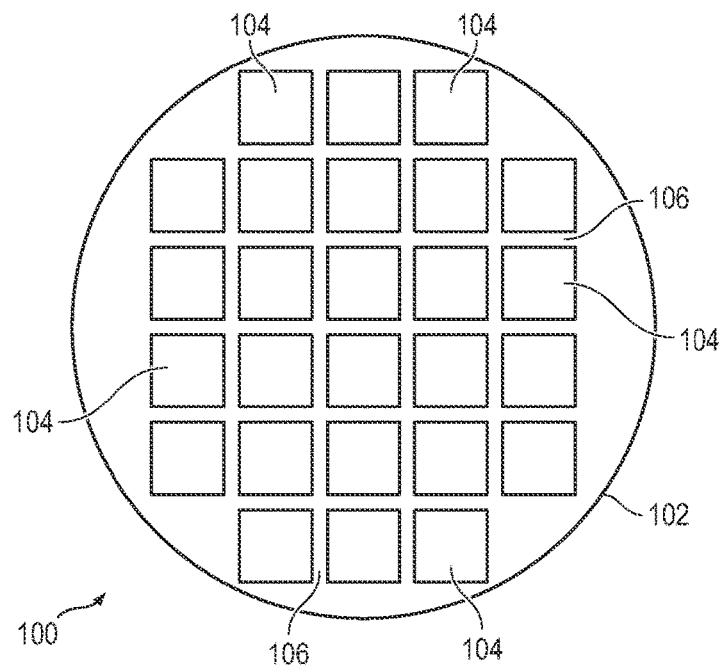
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
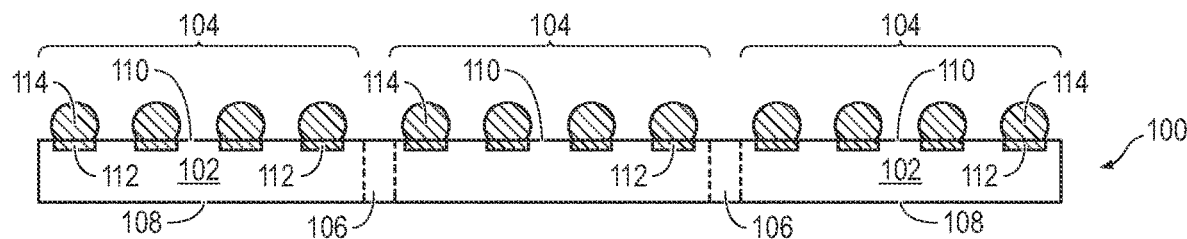

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represents one type of interconnect structure that can be formed over conductive layer 112 for electrical connection to a substrate. The interconnect structure can also use bond wires, conductive paste, stud bump, micro bump, or other electrical interconnect.

Figure 1C:
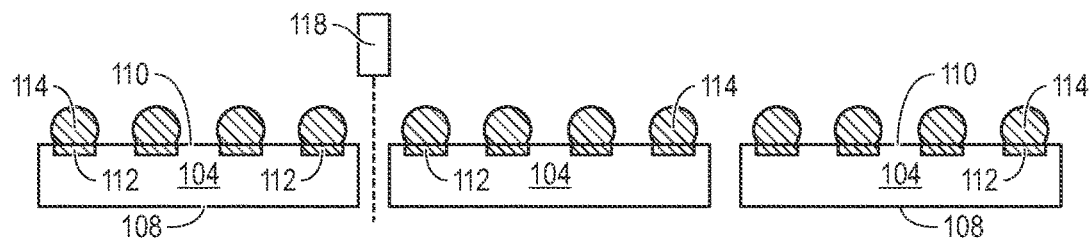

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

FIG. 2a illustrates a cross-section of an exemplary semiconductor package 150 prior to selectively forming a shielding layer. Semiconductor package 150 is a system-in-package (SiP) device in some embodiments. Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154.

Substrate 152 can include any number of conductive layers 156 and insulating layers 154 interleaved over each other. A solder mask or passivation layer can be formed over either side or both sides of substrate 152. Openings are formed in the passivation layer to expose contact pads of conductive layer 156 for subsequent interconnection. Any suitable type of substrate or leadframe is used for substrate 152 in other embodiments. Typically, packages 150 are formed on substrate 152 as a panel large enough to form several to hundreds or thousands of packages at one time. Packages 150 are then singulated into individual packages, of which FIG. 2a shows an example, by cutting through encapsulant 168 and substrate 152.

Any components desired to be shielded in semiconductor package 150 are mounted to or disposed over substrate 152 within shielding area 160 and electrically connected to conductive layers 156. A shielding interface area 161 is provided for connection of the subsequently formed shielding layer to ground strip 171 of conductive layer 156. A non-shielding area 162 contains other components not intended to be shielded. FIG. 2a illustrates semiconductor die 104 mounted on substrate 152 along with discrete electrical components 164 within shielding area 160 as an example. Discrete components 164 can be passive components such as capacitors, resistors, or inductors, active components such as diodes or transistors, or any other desired electrical component. Multiple semiconductor die can be disposed in shielding area 160. Semiconductor die 104 can be provided as part of a smaller sub-package rather than a bare die.

Semiconductor die 104 is mounted to substrate 152 by disposing the semiconductor die on the substrate using, e.g., a pick-and-place process or machine, and then reflowing bumps 114 to physically and electrically connect the bumps to exposed contact pads of conductive layer 156. Discrete components 164 are connected by similar solder bumps or solder paste 166. Solder paste 166 can be printed onto substrate 152 or discrete components 164 prior to picking and placing the discrete components onto the substrate. Reflowing solder paste 166 physically and electrically couples discrete components 164 to contact pads of conductive layer 156.

After mounting of semiconductor die 104, discrete components 164, and any other desired electrical components onto substrate 152 within shielding area 160, the components are encapsulated by encapsulant or molding compound 168. Encapsulant 168 is deposited over substrate 152, semiconductor die 104, and discrete components 164 using paste printing, compressive molding, transfer molding, liquid encapsulant molding, vacuum lamination, spin coating, or another suitable applicator. Encapsulant 168 can be polymer composite material, such as epoxy resin, epoxy acrylate, or polymer with or without a filler. Encapsulant 168 is nonconductive, provides structural support, and environmentally protects the semiconductor device from external elements and contaminants.

A mask or other mechanism can be used to prevent encapsulant 168 from covering shielding interface area 161 and non-shielding area 162. In other embodiments, encapsulant 168 is deposited over shielding interface area 161 and non-shielding area 162 and then removed in the non-shielding area. A passivation layer formed over the top of substrate 152 can operate as an etch stop layer while removing the encapsulant in non-shielding area 162 and shielding interface area 161. Openings are formed in the passivation layer after encapsulant 168 is removed to expose ground strip 171 and contact pads of land grid array 172.

Any electrical components that are desired to be left unshielded are disposed on or over substrate 152 within non-shielding area 162. Non-shielding area 162 is populated with electrical components after encapsulation with encapsulant 168 to reduce complexity of masking the non-shielding area from being encapsulated. In other embodiments, components can be disposed on substrate 152 in non-shielding area 162 prior to depositing encapsulant 168. Components in non-shielded area 162 can include board-to-board connectors and other physical interfaces, antennae disposed over substrate 152 or formed as part of conductive layers 156, additional discrete components 164, or any other desired electrical components.

In FIG. 2a, no components are disposed or formed in non-shielding area 162 over substrate 152. Contact pads of conductive layer 156 are left exposed as a land grid array 172 for electrical interconnection or for addition of electrical components at a later stage. Another portion of conductive layer 156 is left exposed in shielding interface area 161 as ground strip 171. FIG. 2b shows a top-down plan view of ground strip 171 and land grid array 172. Land grid array 172 provides exposed contact pads to electrically connect to semiconductor die 104 or the underlying device that package 150 is incorporated into. The electrical connection can be made by soldering components or a physical port onto land grid array 172, or a temporary connection can be made using a device with pogo pins or other suitable structure.

Figure 2D:
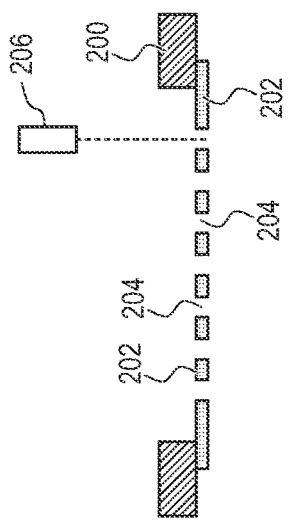
Figure 2D:
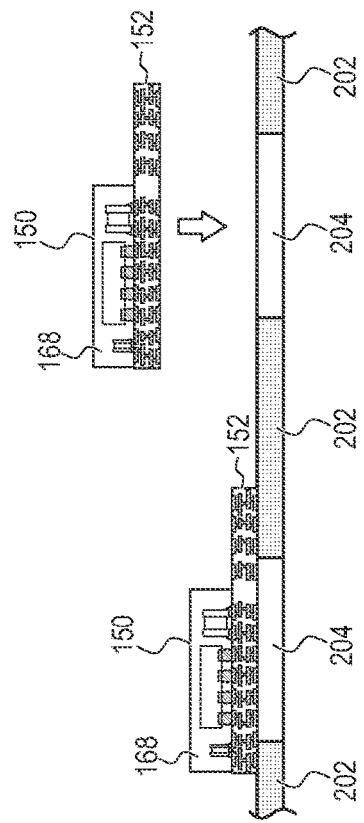
Figure 2D:
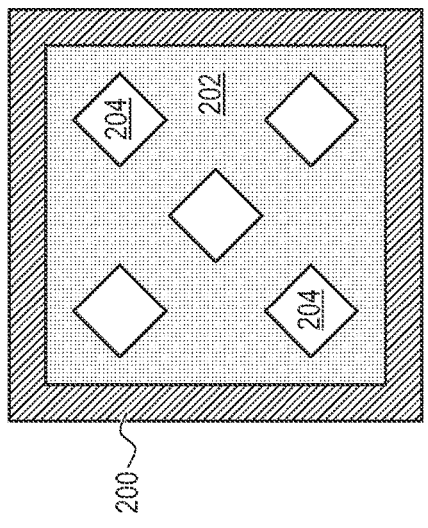
Figure 2E:
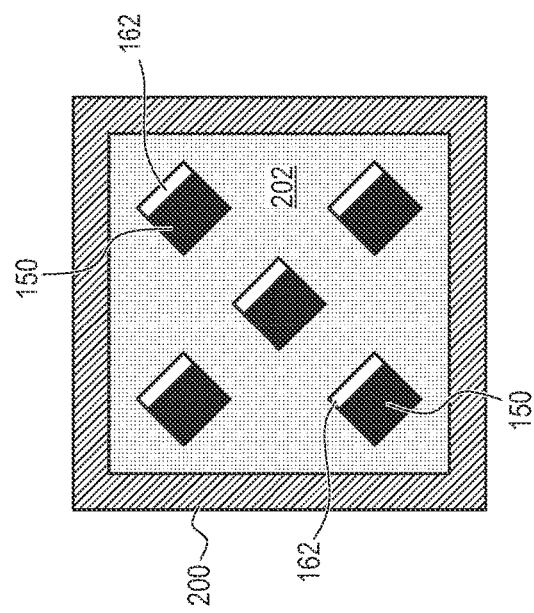

FIG. 2c shows a metal frame 200 and film 202 that will be used as a carrier during formation of a shielding layer over package 150. FIG. 2c includes a top-down view on the left side of the figure and a cross-sectional view on the right side of the figure. FIGS. 2d, 2e, and 2g similarly show both a top-down view and a cross-sectional view of their respective processing steps. Frame 200 can be formed of aluminum, copper, steel, or another suitable metal. Alternatively, frame 200 can be formed from plastic, wood, or any other suitable rigid material. A tape or film 202 is mounted onto frame 200 to form a support base for a plurality of packages 150. Film 202 is formed from polyimide (PI) in one embodiment. Film 202 has an adhesive coated on a surface of the film to allow the film to stick to metal frame 200 and to allow packages 150 to adhere to the film. The adhesive on film 202 can be a thermal or ultraviolet (UV) release adhesive.

In FIG. 2d, a plurality of openings 204 is formed through film 202 using laser cutting tool 206, a mechanical punch, or any other suitable mechanism. Openings 204 are smaller than the footprint of packages 150 to allow the packages to be disposed on film 202 over the openings. Openings 204 facilitate removal of packages 150 from film 202 after forming a shielding layer.

In FIG. 2e, packages 150 are disposed over openings 204 using a pick-and-place process or machine. The bottom of substrate 152 physically contacts film 202 all the way around opening 204 such that each opening 204 is completely covered by a package 150. In one embodiment, the overlap of substrate 152 over film 202 around opening 204 is between 0.1 mm and 0.5 mm on each side of the substrate. In other embodiments, openings 204 extend partially outside of the footprints of packages 150. Adhesive on film 202 sticks packages 140 to the film.

Figure 2F:
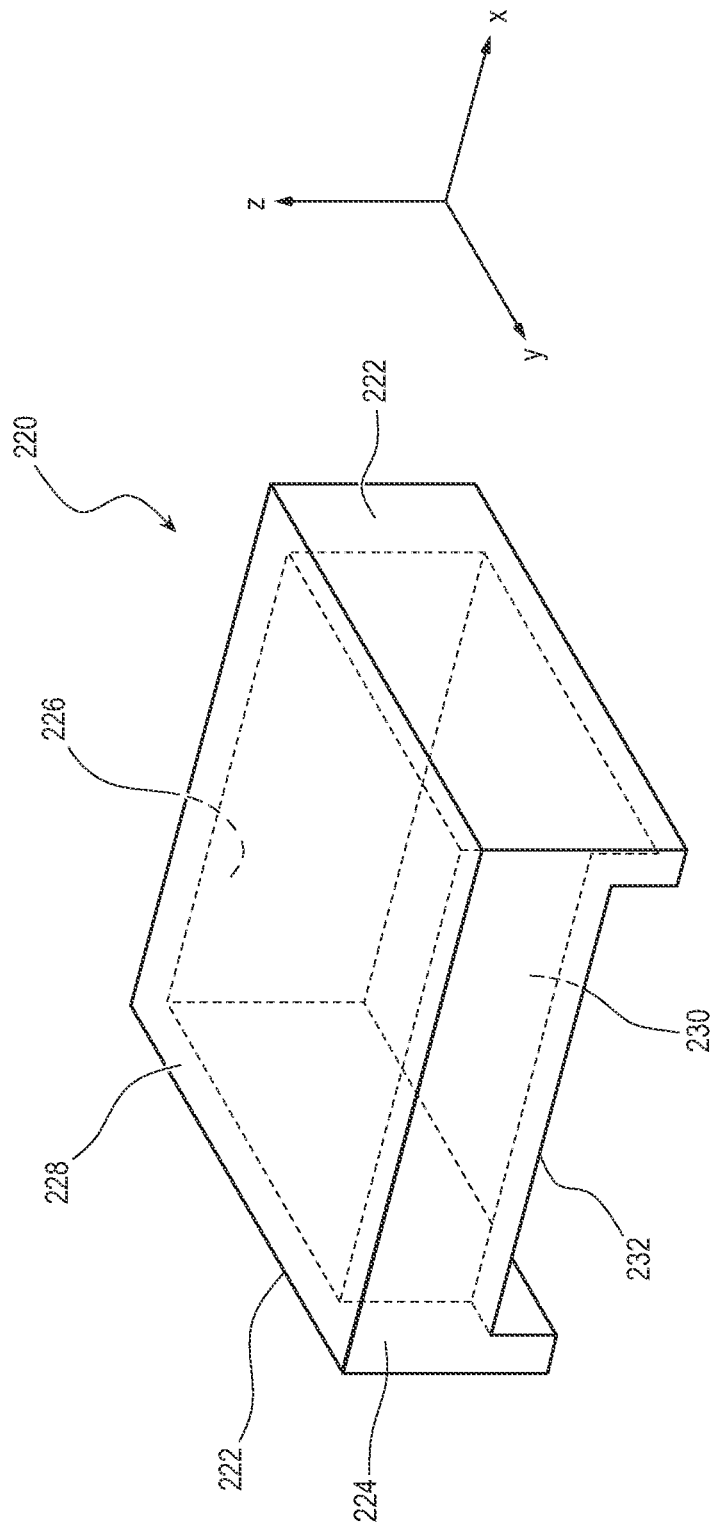

FIG. 2f shows a preformed mask 220 that will be placed over non-shielding area 162 to block a shielding layer from being formed directly on the underlying components. Mask 220 includes sides 222, front 224, back 226, and top 228 that define a mask cavity 230. Each of sides 222, front 224, and back 226 has a height in the Z-axis direction of the illustrated axis. Sides 222 have widths along the Y-axis and thicknesses along the X-axis. Front 224 and back 226 have widths along the X-axis and thicknesses along the Y-axis. Top 228 has a thickness along the Z-axis, a length along the X-axis, and a width along the Y-axis.

Land grid array 172 is disposed in mask cavity 230 during formation of the shielding layer. Sides 222 and back 226 have heights that are at least as high as the top of substrate 152. In embodiments with components disposed on substrate 152 within non-shielding area 162, mask 220 is made at least as tall as the tallest component within non-shielding area 162. The bottoms of sides 222 and back 226 can rest on film 202 with top 228 extending over land grid array 172 or other components. Front 224 has a bottom lip 232 that is raised higher than the bottoms of sides 222 and back 226 along the Z-axis. The opening under lip 232 provides space for substrate 152 to extend from under mask 220 to outside the mask.

Lip 232 contacts, or nearly contacts, the top surface of substrate 152 while sides 222 and back 224 extend down to surround the end of the substrate with non-shielding area 162. The length of lip 232 along the X-axis is approximately the same or slightly longer than a width of substrate 152 in the same direction so that sides 222 contact or nearly contact the sides of the substrate. The widths of sides 222 are greater than a width of non-shielding area 162 so that back 226 sits just outside a footprint of substrate 152 when lip 232 is placed on the border between shielding interface area 161 and non-shielding area 162.

Mask 220 is formed of metal, liquid-crystal polymer (LCP), plastic, polymer, Teflon, glass, rubber, wood, film, tape, foil, combinations thereof, or any other solid material that can withstand the process of forming a shielding layer. Mask 220 is formed by molding, by folding or working a sheet of material into the desired shape, or by any other suitable means.

Figure 2I:
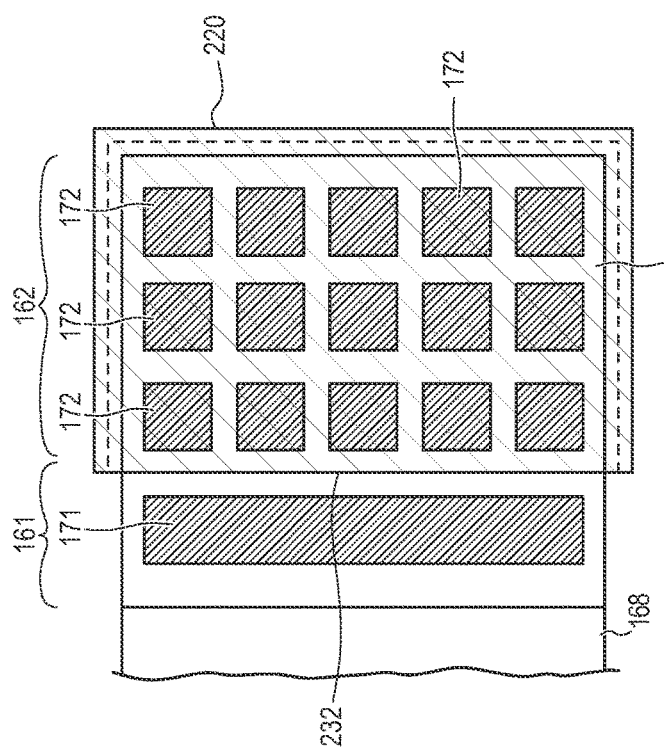

FIGS. 2g-2i show packages 150 with masks 220 picked and placed over non-shielding areas 162. FIG. 2g shows top-down and cross-sectional views, while FIG. 2h shows a perspective view and FIG. 2i shows a detailed top-down plan view. Mask 220 covers non-shielding area 162 to block metal molecules from being deposited on land grid array 172 during sputtering of a shielding layer. Shielding area 160 and shielding interface area 161 remain exposed for the formation of a shielding layer over those areas.

Land grid array 172, or any desired non-shielded electrical components, are disposed within cavity 230 of mask 220. The bottoms of sides 222 and back 226 rest on film 202. Lip 232 on the bottom of front 224 contacts or is slightly above the top surface of substrate 152. Top 228 extends over the top of land grid array 172. The portion of substrate 152 within non-shielding area 162 extends between sides 222. Sides 222 and back 226 are sized and positioned to contact or nearly contact substrate 152.

Figure 2J:
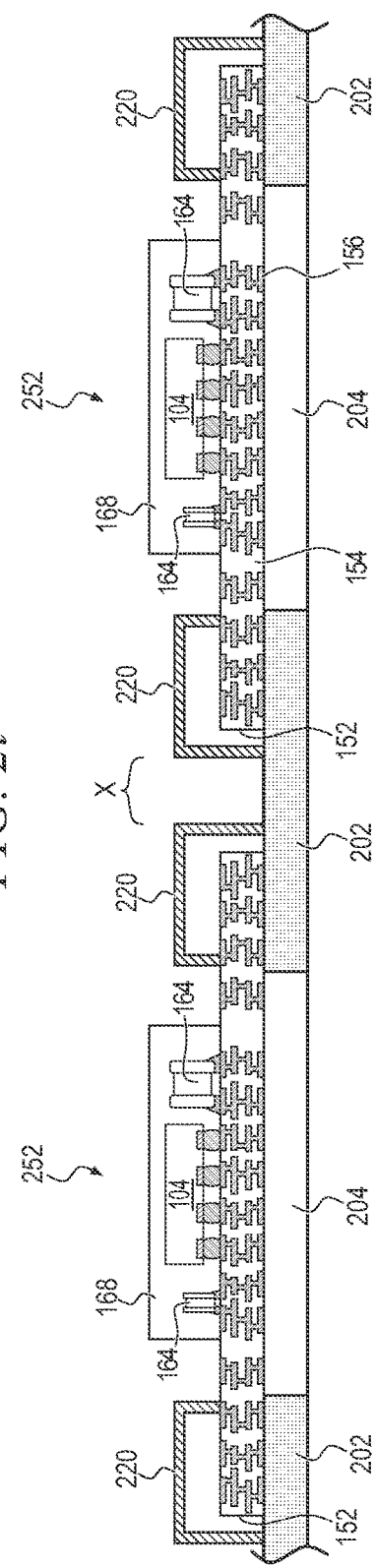

FIG. 2j shows another embodiment where packages 252 each have two land grid arrays 172, one on each of two opposite sides of substrate 152. Two masks 220 are used per package to mask both land grid arrays. When two masks 220 of adjacent packages 252 are disposed directly adjacent to each other, a space 'X' of at least 2 mm is maintained between the masks. Any number of land grid arrays or other components can be used with masks 220 shaped appropriately to cover all of the non-shielded components. Multiple masks are used when the components are disposed in multiple groupings on substrate 152.

Figure 2K:
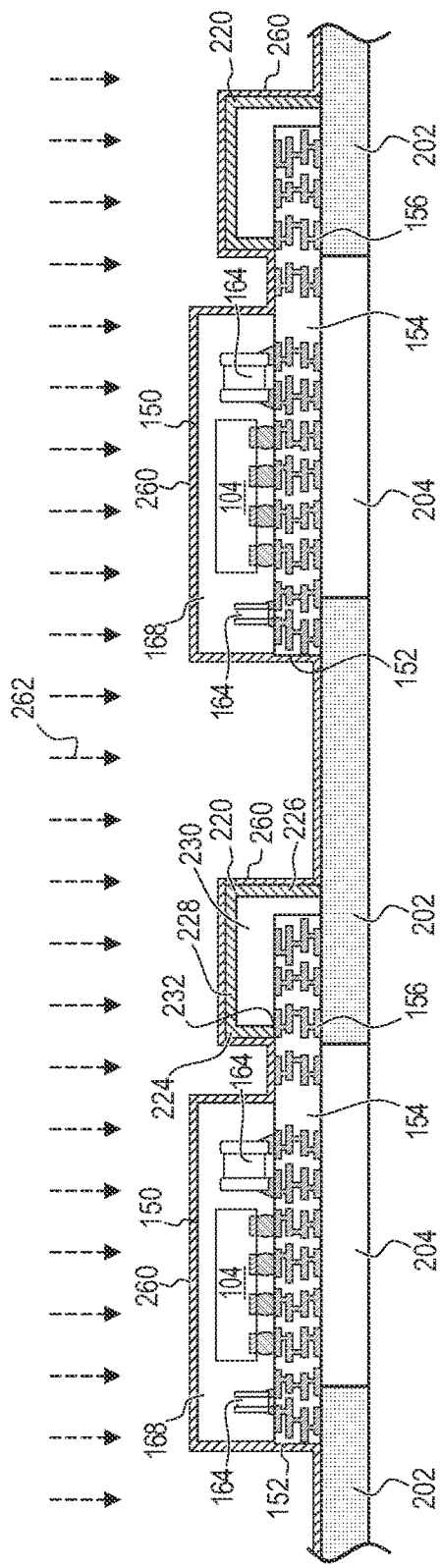

FIG. 2k, continuing from FIGS. 2g-2i, illustrates a conductive material being sputtered over packages 150, as indicated by arrows 262, to form a shielding layer 260. Shielding layer 260 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable shielding layer material. Shielding layer 260 completely covers exposed surfaces of package 150 and mask 220. In particular, all four side surfaces and the top surface of encapsulant 168 are covered by shielding layer 260 to surround the encapsulated components. Shielding layer 260 covers mask 220, but the sputtered metal does not penetrate the mask. Shielding layer 260 is therefore not formed directly on land grid array 172. All side surfaces of substrate 152 other than within mask 220 are covered by shielding layer 260.

The top surface of substrate 152 in shielding interface area 161, between encapsulant 168 and mask 220, is covered by shielding layer 260. The top surface of substrate 152 in shielding interface area 161 includes exposed ground strip 171, or a plurality of discrete contact pads, of conductive layer 156 that shielding layer 260 physically contacts to provide an electrical connection to a ground voltage node. In some embodiments, a portion of conductive layer 156 is exposed at a side surface of substrate 152 so that shielding layer 260 physically contacts the conductive layer on the sides of the substrate as well.

Figure 2L:
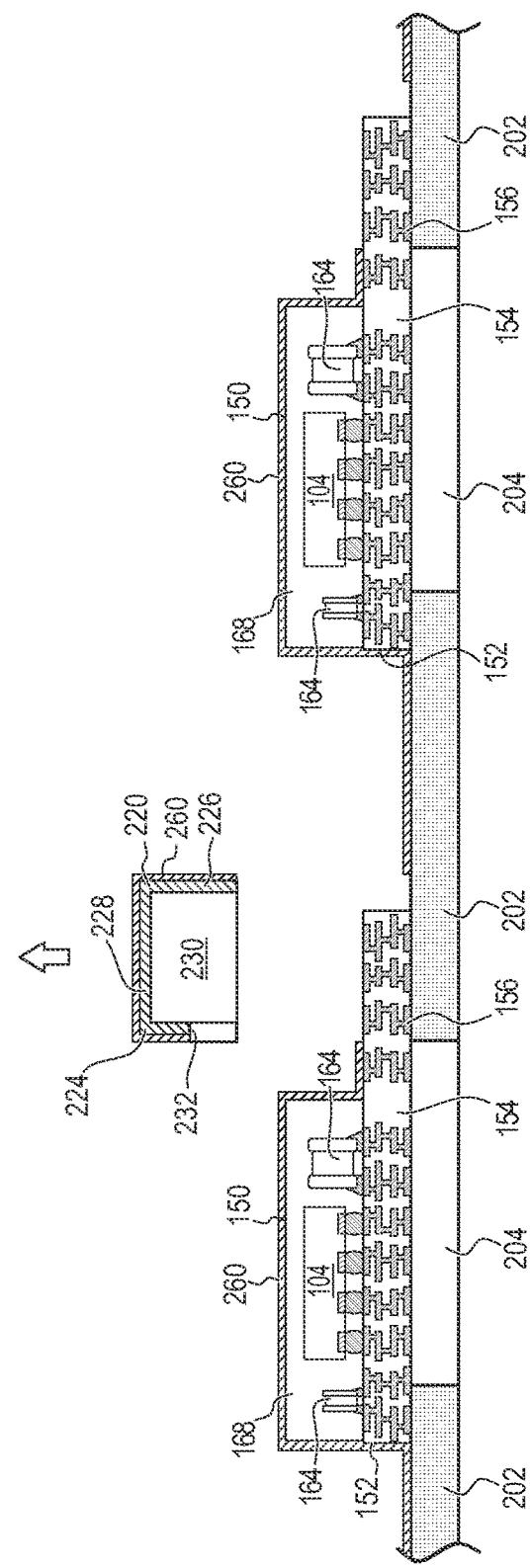

In FIG. 2l, masks 220 are removed, including the portion of shielding layer 260 formed on the masks. Masks 220 can be removed using the same pick and place machine that placed the masks in FIG. 2h or using any other suitable mechanism. With masks 220 removed, the area within frame 200 remains completely covered in shielding layer 260 other than openings in the shielding layer around land grid array 172 where masks 220 had been located.

Masks 220 are reusable, so the pick and place machine places the masks into a tray or other suitable storage medium for later re-application onto the next set of packages to be shielded. Masks 220 may deteriorate after multiple uses, or have another factor that limits the number of times an individual mask can be used. Testing can be done on a particular mask design, and then each mask can be discarded after a suitable number of reuses determined via testing. A metal mask 220 can typically be reused about thirty times.

Packages 150 are unloaded from frame 200 and film 202 in FIG. 2m. An actuator 270 presses on the bottom of substrate 152 through openings 204 to release packages 150 from the adhesive of film 202. A UV light or heat can be applied to reduce the effect of the adhesive between film 202 and substrates 152. Actuator 270 can move from package to package in concert with a pick and place machine that takes the lifted package 150 and loads a JEDEC tray, tape and reel, or other similar storage medium with the shielded packages. Shielding layer 260 remains covering encapsulant 168, a portion of the side surfaces of substrate 152, and the top surface of the substrate within shielding interface area 161.

FIG. 3 shows an enlarged cross-section of a completed package 150. Shielding layer 260 surrounds semiconductor die 104 and discrete components 164 on all sides and on top. Shielding layer 260 extends down the side surfaces of substrate 152 within shielding area 160 and shielding interface area 161. Shielding layer 260 covers the top surface of substrate 152 within shielding interface area 161, including physically contacting ground strip 171. Masks 220 have ensured that shielding layer 260 does not cover the portion of substrate 152 with land grid array 172 so that the land grid array remains available for later use.

In some embodiments, the bottom surface of substrate 152, opposite semiconductor die 104, has solder bumps or another suitable interconnect structure formed on contact pads of conductive layer 156 for attaching and connecting packages 150 to a larger PCB of an electronic device. Contact pads of conductive layer 156 can remain exposed on the bottom surface as a bottom land grid array rather than adding another interconnect structure. While the process illustrated uses a metal frame 200 and film 202 as a carrier for packages 150 during formation of shielding layer 260, any suitable type of carrier can be used, such as a panel of glass, aluminum, steel, copper, polymer, silicon, or another suitable material.

Mask 220 has the advantages of being simple and reducing costs. Simplicity is provided by using a mask that can be placed and removed using common pick-and-place processing equipment. Cost is reduced by reusing mask 220. The overall process is streamlined by allowing non-shielded components to be disposed on substrate 152 during the same manufacturing stage as shielded components, e.g., semiconductor die 104. Prior art masking methods, e.g., tape masking, require that non-shielding area 162 remain free of components until after the shielding layer is formed and the mask is removed.

Figure 4A:
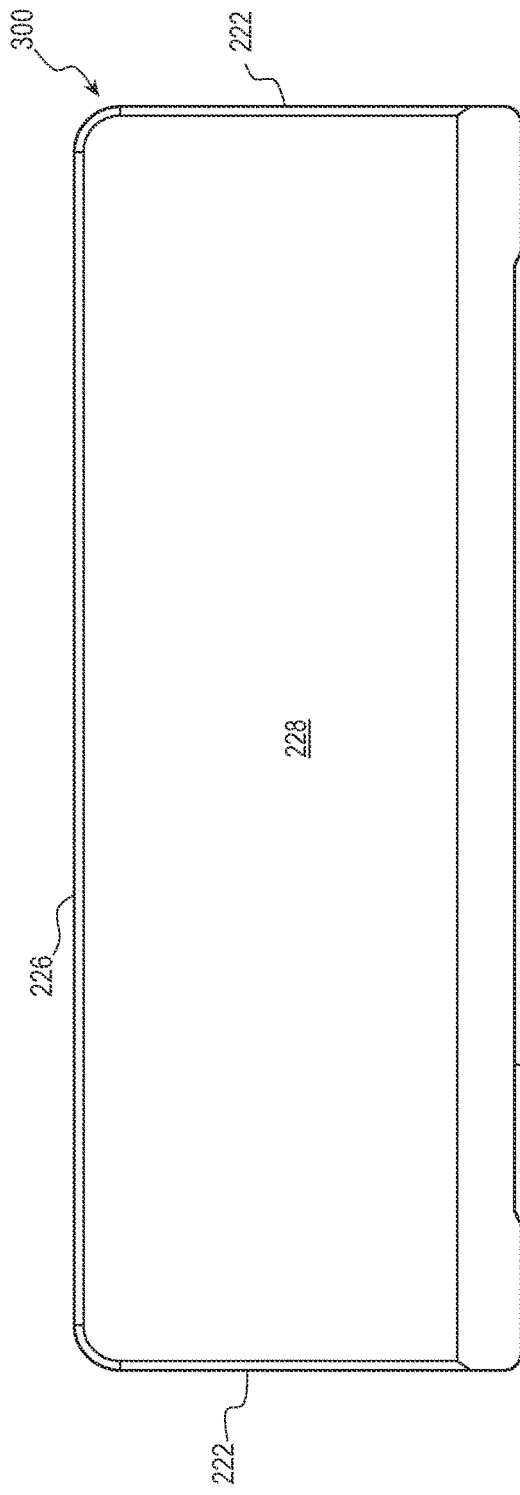
FIGS. 4a-4c illustrate a mispositioned mask potentially causing a manufacturing defect.
Figure 4B:
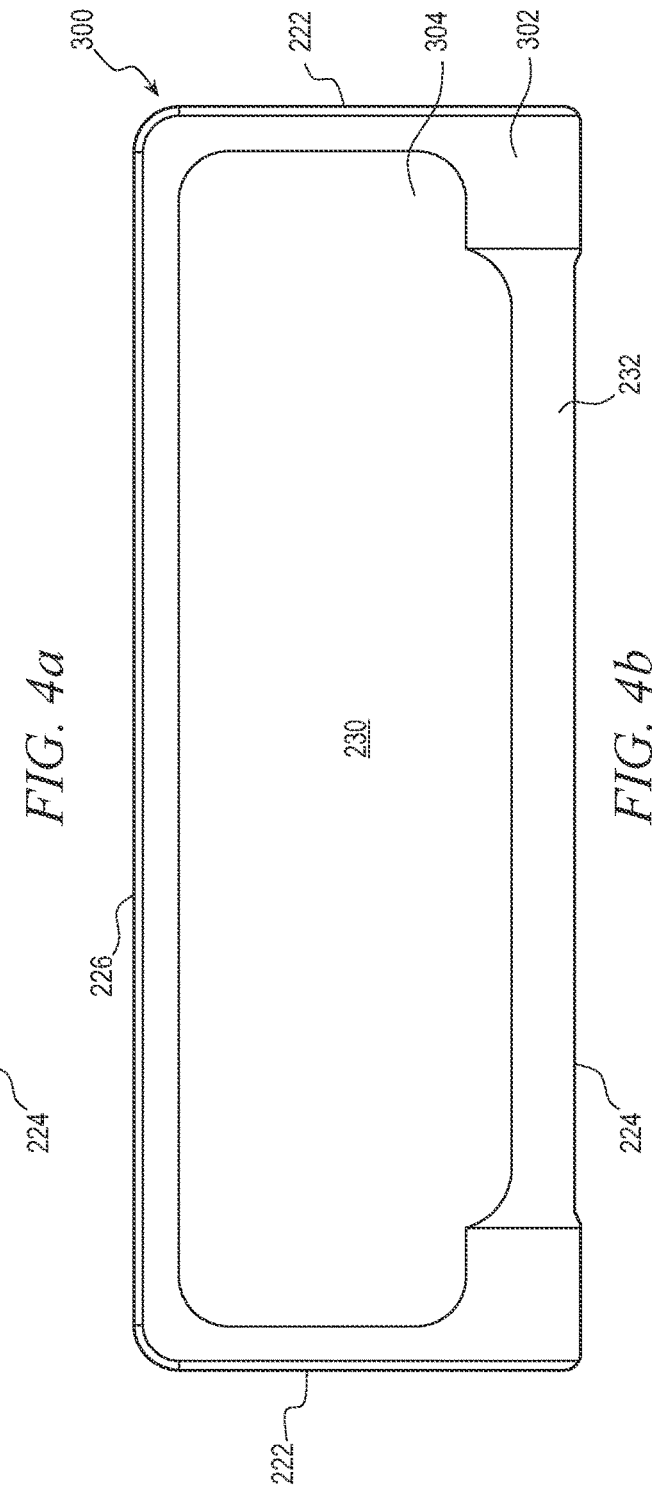

FIGS. 4a and 4b show footprint views of another embodiment as mask 300. FIG. 4a is a plan view of top 228, while FIG. 4b is a bottom plan view showing cavity 230. Mask 300 is machined from a block of aluminum using a CNC milling machine, laser etching, chemical etching, or another suitable means. In other embodiments, mask 300 is molded or formed using another process. Mask 300 can be formed out of any suitable metal, polymer, or other material.

The top and bottom views of mask 300 include minimal features that would be easy for a computer vision system to reliably distinguish. Even though a bottom surface 302 of mask 300, lip 232, and surface 304 within cavity 230 are all at different elevations when mask 300 is viewed from the bottom, a vision camera may not be able to recognize a border between the features depending on the exact angle and lighting in a given situation.

Figure 4C:
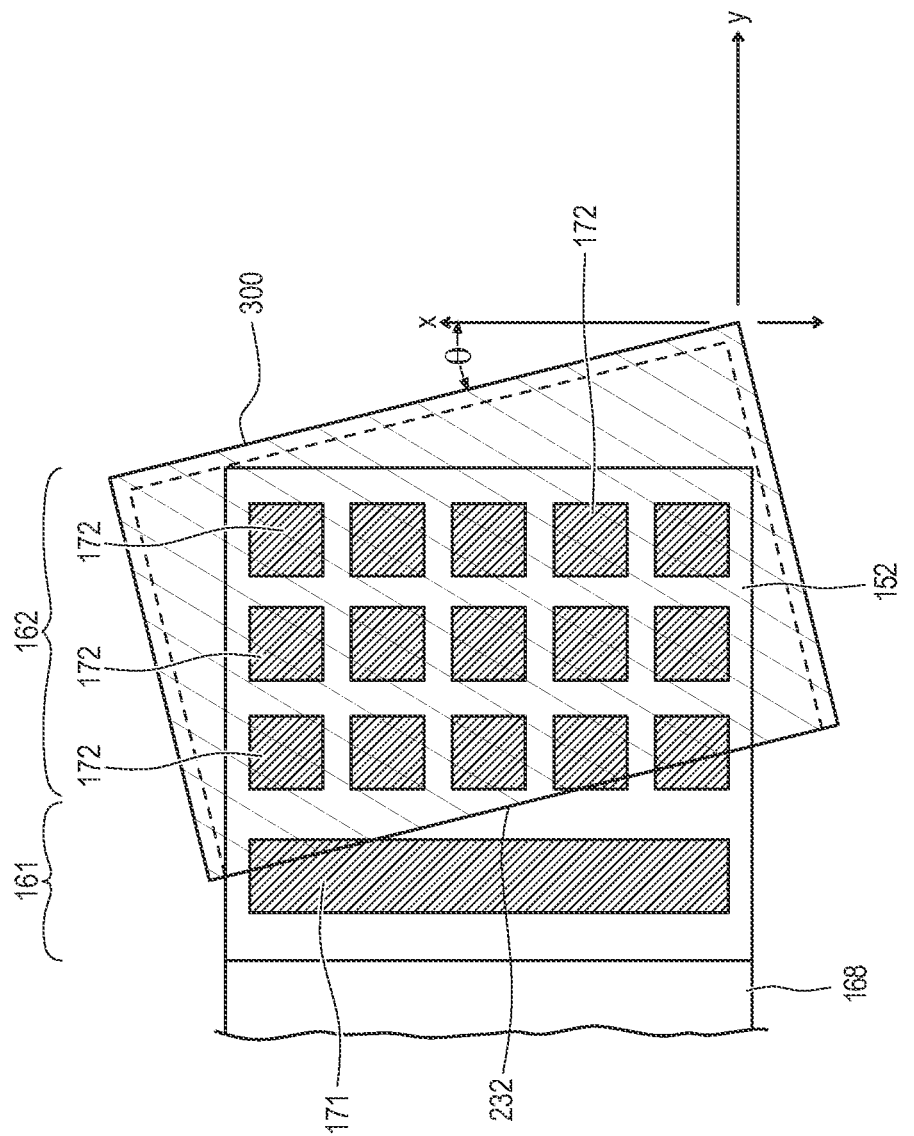

Without any significant distinguishing visual features, a pick-and-place machine utilizing a vision camera to locate a mask 300 is likely to place the mask over a package 150 misaligned as shown in FIG. 4c. Mask 300 in FIG. 4c has an angular offset relative to package 150 indicated by the character theta (θ). Sides 222 of mask 300 should be parallel to the Y-axis in FIG. 4c, while front 224 and back 226 should be parallel to the X-axis. However, theta misalignment causes the sides, front, and back to be off by an angle theta from the desired orientation.

Depending on the exact positioning of mask 300 relative to non-shielding region 162, the theta offset can cause multiple problems. The theta offset can result in a portion of ground strip 171 being covered by mask 300, in which case the connection of shielding layer 260 to ground will end up not being as strong as originally intended. Such a manufacturing defect increases resistance to ground for shielding layer 260 and may result in a reduction in the performance of the shielding layer. Additionally, one or more contact pads of land grid array 172 may be outside of the protection of mask 300, in which case shielding layer 260 will be formed extending to the exposed pads. Unexpectedly short circuiting a land grid array 172 contact pad to shielding layer 260 is likely to cause a malfunction in the end device.

Figure 5A:
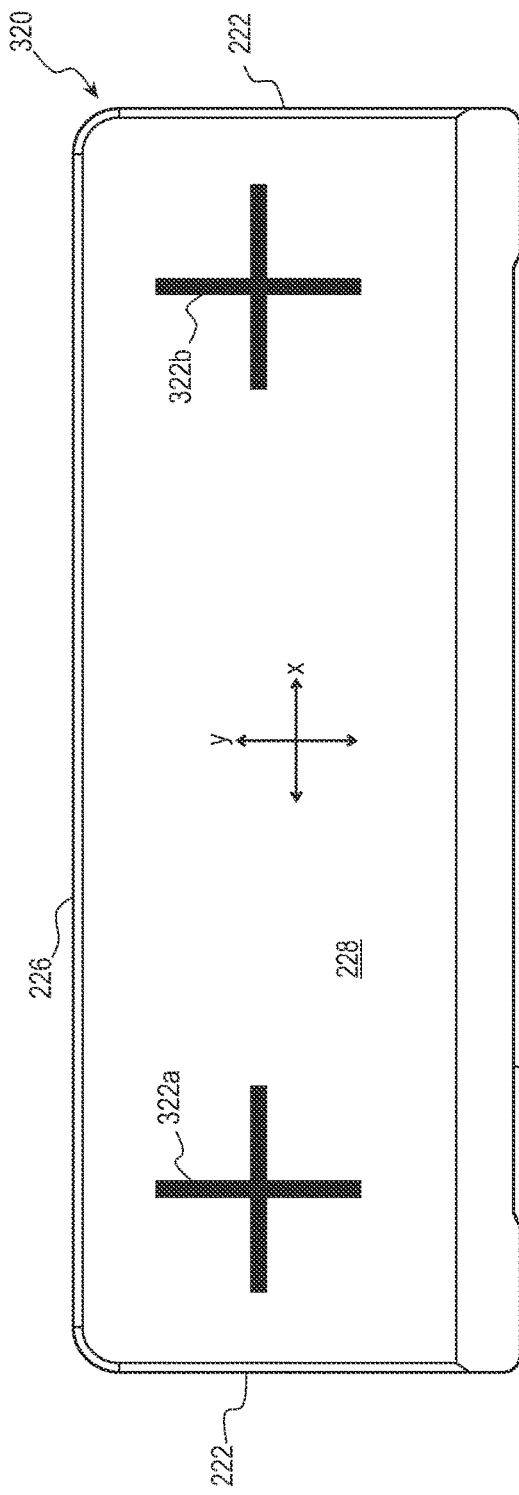
FIGS. 5a and 5b illustrate a preformed mask with fiducial markers to improve alignment.
Figure 5B:
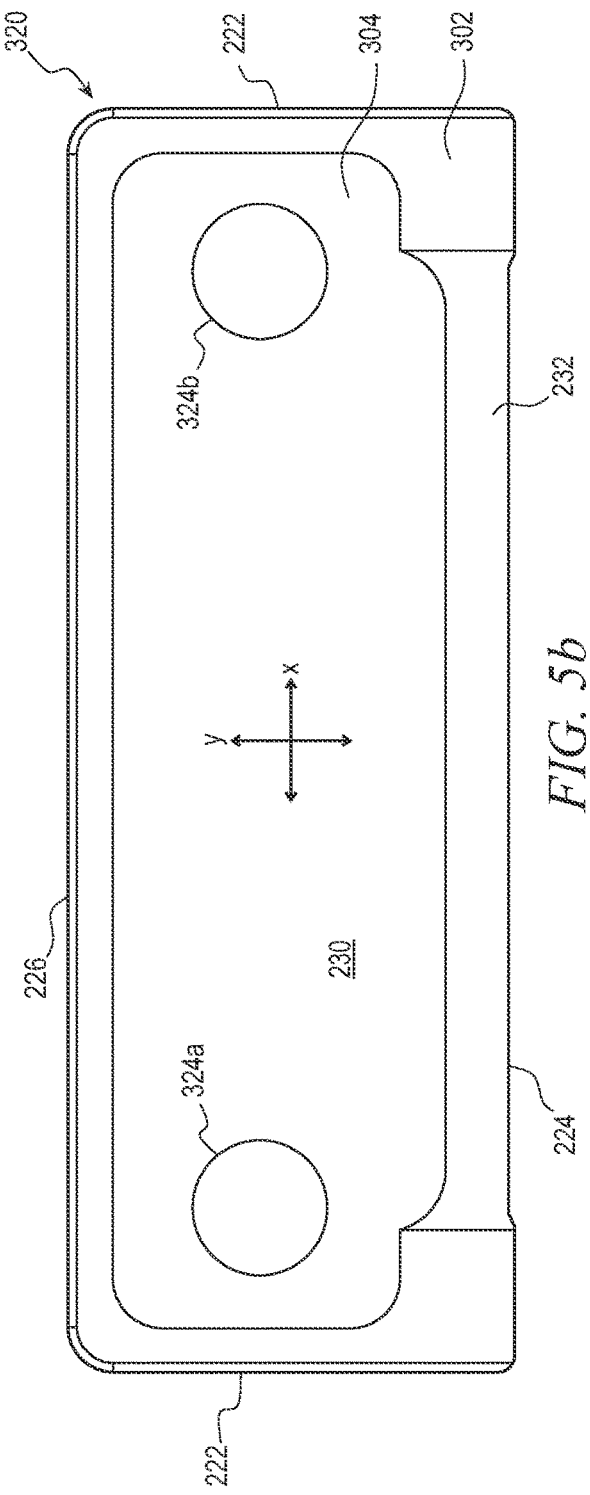

FIGS. 5a and 5b illustrate a mask 320 with fiducial markers 322a and 322b on top 228 and fiducial markers 324a and 324b on surface 304 in cavity 230. Fiducial markers 322 and 324 help a vision camera theta-align masks 320 by giving the camera two discrete and easily visible markers at opposite sides of the mask from each other. Markers 322a and 322b are aligned with each other along the y-axis and have significant separation from each other along the x-axis. In one embodiment, fiducial markers 322 are approximately centered between front 224 and back 226, and a distance from the center of a fiducial to the closer side 222 is approximately equal to half the distance from the front to the back. Fiducial markers 324 can likewise be centered between three adjacent sidewalls within cavity 230 or may be formed directly under and aligned to fiducial markers 322. In other embodiments, fiducials 322 and 324 can be formed at any suitable position.

Fiducials 322 and 324 are formed using ink, paint, or another suitable substance disposed on mask 320 using printing, spraying through a mask, brushing over a mask, or another suitable mechanism to form the substance in the desired fiducial shape. In other embodiments, color is added to mask 320 by anodization to form fiducials 322 and 324. Fiducials can be formed in any desired color that contrasts with mask 320. The fiducials can contrast in any way, whether by being a different color, a different texture, a different material, or any other machine discernable difference. Fiducials 322 and 324 can also be formed by etching into the surfaces of mask 320 rather than or in addition to adding a colored material to the mask. Fiducials 322 and 324 can be formed in any suitable shape, such as circle, triangle, rectangle, square, cross, or star. The fiducial shapes can be outlines only or entirely filled in shapes.

Fiducial markers 322 and 324 provide a pair of discrete markers on each side of mask 320 that a vision camera can easily distinguish. Either fiducials 322 or 324, depending on whether the vision camera is located above or below mask 320, are used by the vision camera to theta-align the mask to package 150, thus ensuring a high likelihood that ground strip 171 will be fully exposed outside the mask and land grid array 172 will be fully covered by the mask. In one embodiment, a pick-and-place machine picks up a mask 320, moves the mask over a vision camera, and then uses feedback from the vision camera to confirm alignment of fiducials 324a and 324b on the y-axis prior to disposing the mask over land grid array 172. Top fiducials 322 also help the vision camera recognize mask 320 when removing the mask after formation of shielding layer 260.

Figure 6:
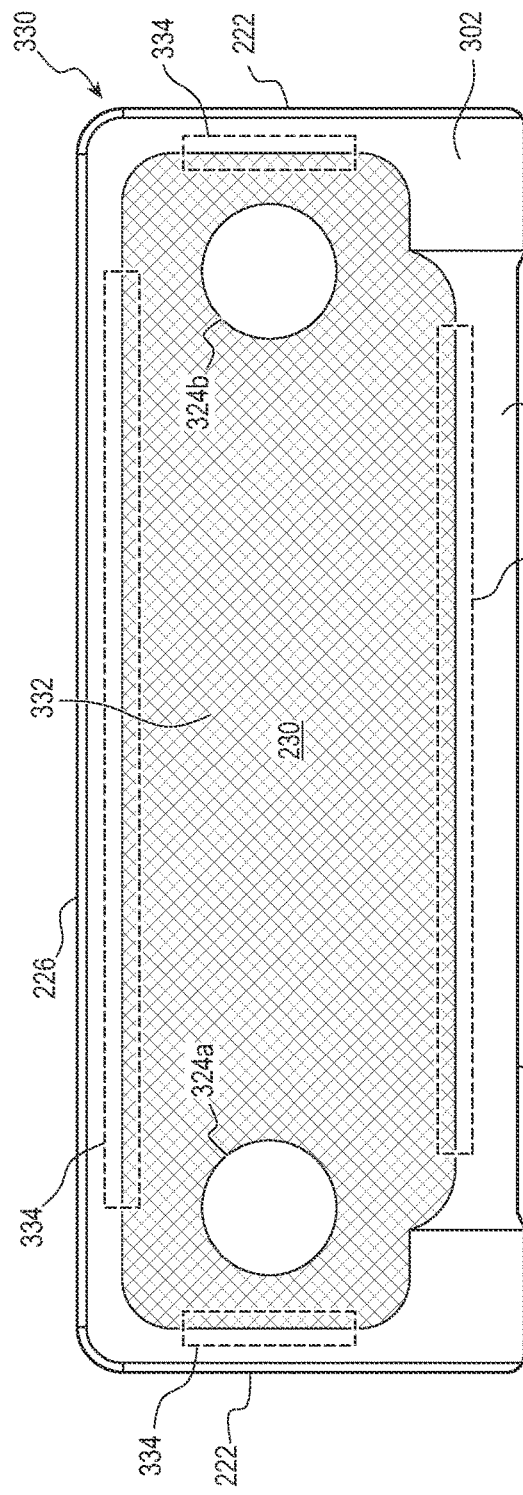
FIG. 6 illustrates a mask with colorful anodizing to improve alignment.

Another problem with mask 300 is that a lack of feature contrast makes teaching the vision camera to recognize the mask difficult. FIG. 6 shows a mask 330 with surface 304 within cavity 230 anodized to create an anodized surface 332. Surface 302 and the bottom of lip 232 are covered with a polyimide tape or other suitable mask during anodization so that the process colorizes the inside of cavity 230 while leaving a clearly distinguishable outline of uncolored mask 330 material surrounding the cavity. Anodized surface 332 creates a readily apparent light and shade boundary line at important vision teaching areas 334. The teaching areas 334 after anodization create four straight lines clearly establishing the position of mask 330 for the vision camera. The contrast lines in teaching areas 334 makes training a vision camera to recognize mask 330 easy. Accurate training of the vision camera results in mask 330 being properly theta-aligned when disposed over land grid array 172, thus reducing manufacturing defects.

Contract can be provided between surface 332 and the surrounding surfaces 302 and 232 in any suitable manner. The contract can be provided by anodizing or otherwise depositing a material on one side, the other, or both. The anodizing can create a visible color contrast or a contrast that is invisible to the human eye but machine detectable. The contract can be a difference in color, texture, material, or any other quality of the surfaces or underlying material.

A mask with both anodization and fiducial markers 324 can be formed by drilling or etching into surface 332 and only partially through top 228 after anodizing. The hole drilling removes a portion of the anodized surface, revealing the underlying color of raw mask 330 material, so that fiducial markers have a color and shade contrast due to the underlying raw mask 330 material. In other embodiments, fiducial markers 324 can be formed prior to anodization and then masked so that the markers are not covered up. Fiducial markers 324 may also be formed on top of the anodized surface 304 after anodization.

Figure 7:
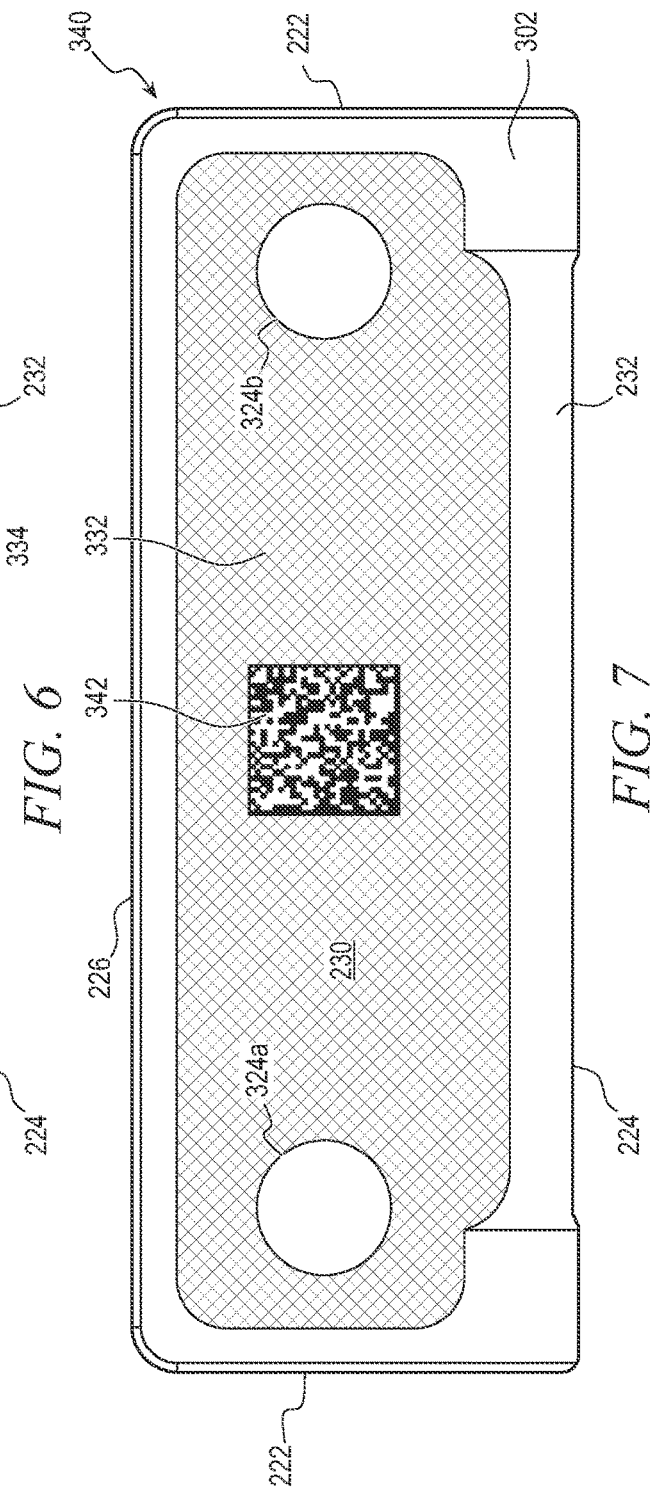
FIG. 7 illustrates a mask with a two-dimensional barcode.

FIG. 7 shows a mask 340 that adds a two-dimensional barcode 342 on anodized surface 332. A quick response (QR) code is an example of a type of two-dimensional barcode that could be used. Other methods of embedding data into a visual representation on surface 332 can be used in other embodiments. Barcode 342 adds traceability to masks 340. Each mask 340 can have a unique identification number embedded in barcode 342 that is used for tracking. A computer system can programmatically scan a barcode and log scan history, location, usage, application, and other aspects of masks 340 and their use. The tracking with barcode 342 allows monitoring of the number of uses each mask 340 has been through, so that a reuse limit can be easily enforced. The reuse limit reduces the likelihood that a mask 340 will be reused to the point of wear and tear causing malfunction. Barcode 342 is formed on surface 332 in cavity 230, but could be formed on top 228 instead or in addition. Barcode 342 can be printed directly on surface 332 or 304, or printed on a sticker and then adhered to the surface of mask 340. Barcode 342 can be used with any of the above-disclosed embodiments.

Figure 8A:
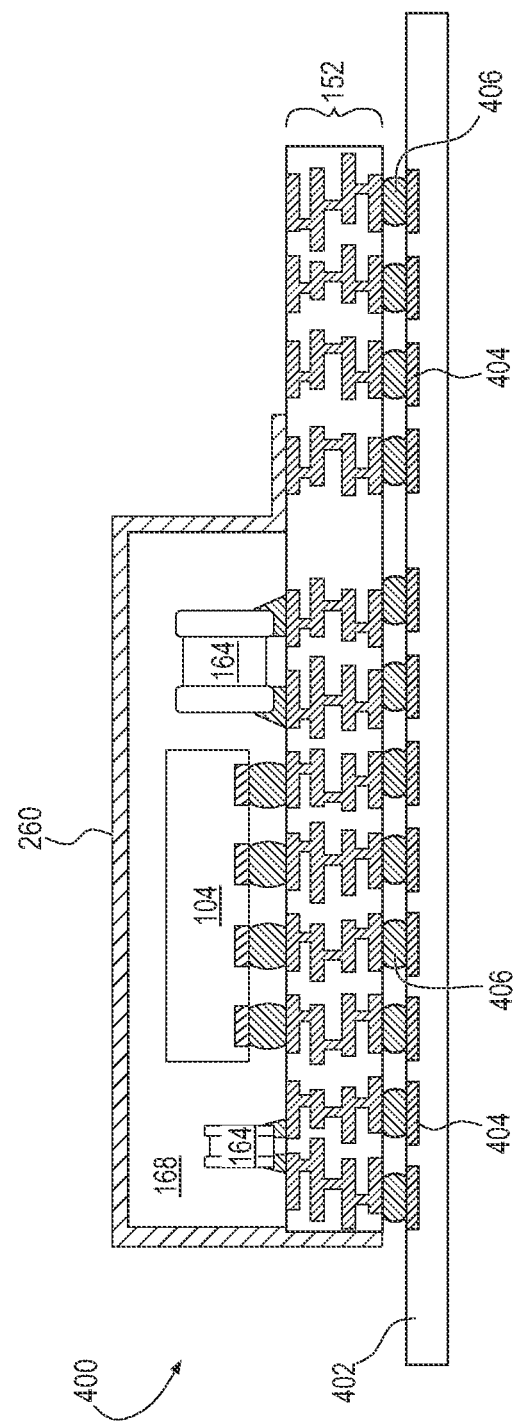
FIGS. 8a and 8b illustrate integrating the selectively shielded packages into an electronic device.
Figure 8B:
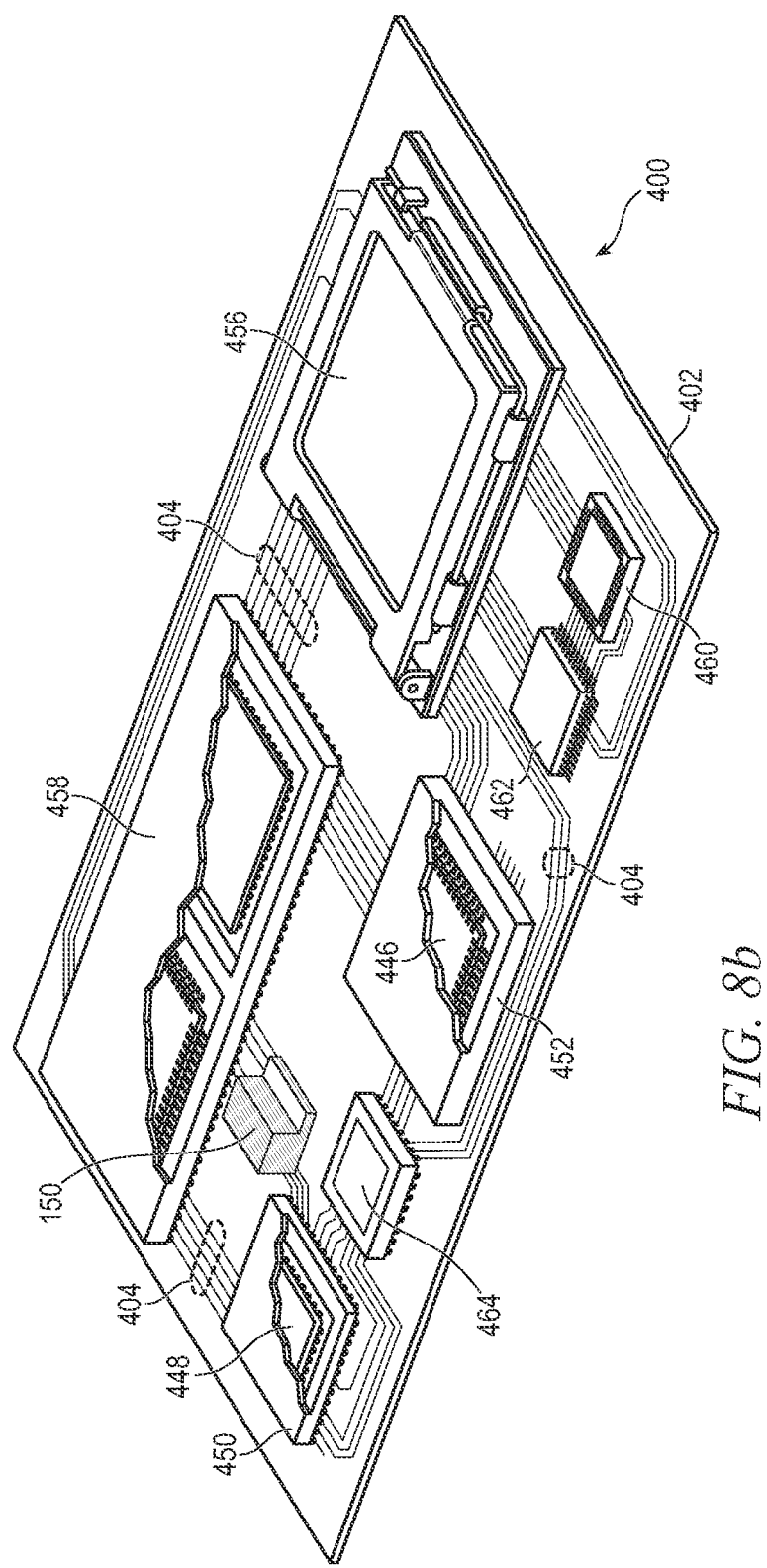

FIGS. 8a and 8b illustrate incorporating the above described shielded packages, e.g., package 150 with shielding layer 260, into an electronic device. FIG. 8a illustrates a partial cross-section of package 150 mounted onto a printed circuit board (PCB) or other substrate 402 as part of an electronic device 400. Bumps 406 are formed on conductive layer 156 on the bottom of substrate 152. Conductive bumps 406 can be formed at any stage of the manufacturing process, e.g., prior to molding encapsulant 168, prior to singulation, or after forming shielding layer 260. Bumps 406 are reflowed onto conductive layer 404 of PCB 402 to physically attach and electrically connect package 150 to the PCB. In other embodiments, thermocompression or other suitable attachment and connection methods are used. In some embodiments, an adhesive or underfill layer is used between package 150 and PCB 402. Semiconductor die 104 is electrically coupled to conductive layer 404 through substrate 152 and bumps 406.

FIG. 8b illustrates electronic device 400 including PCB 402 with a plurality of semiconductor packages mounted on a surface of the PCB, including package 150 with shielding layer 260 and land grid array 172. Land grid array 172 can have an interconnect structure soldered to or pressed against the land grid array to connect package 150 to PCB 402, another package on PCB 402, another PCB of the same or different electronic device, another package on another PCB, another electronic device, testing equipment, etc. Land grid array 172 can also simply be left exposed for subsequent temporary electrical connection to package 150. Alternatively, other components instead of land grid array 172 remain exposed to provide their intended function without shielding layer 260 interfering. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 8b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 446 and flipchip 448, are shown on PCB 402. Additionally, several types of second level packaging, including ball grid array (BGA) 450, bump chip carrier (BCC) 452, land grid array (LGA) 456, multi-chip module (MCM) 458, quad flat non-leaded package (QFN) 460, quad flat package 462, and embedded wafer level ball grid array (eWLB) 464 are shown mounted on PCB 402 along with package 150. Conductive traces 404 electrically couple the various packages and components disposed on PCB 402 to package 150, giving use of the components within package 150 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor package including,
      a substrate comprising a land grid array,
      a component disposed over the substrate, and
      an encapsulant deposited over the component, wherein the land grid array remains outside the encapsulant;
   disposing a metal mask including a fiducial marker over the land grid array;
   forming a shielding layer over the semiconductor package; and
   removing the metal mask after forming the shielding layer.

2. The method of claim 1, wherein the metal mask includes a pair of fiducial markers on opposite ends of the metal mask.

3. The method of claim 2, wherein the fiducial markers are formed on a top surface of the metal mask.

4. The method of claim 2, wherein the fiducial markers are formed within a cavity of the mask.

5. The method of claim 1, wherein the mask includes a two-dimensional barcode.

6. The method of claim 1, further including anodizing a first surface of the metal mask while a second surface of the metal mask surrounding the first surface remains devoid of anodization.

7. A method of making a semiconductor device, comprising:
   providing a semiconductor package including a substrate and an encapsulant deposited over a first portion of the substrate;
   disposing a mask including a fiducial marker and a two-dimensional barcode over a second portion of the substrate;
   forming a shielding layer over the encapsulant; and
   removing the mask.

8. The method of claim 7, wherein the mask includes a pair of fiducial markers positioned symmetrically.

9. The method of claim 7, wherein the fiducial marker is formed on a top surface of the mask.

10. The method of claim 7, wherein the fiducial marker is formed in a cavity of the mask.

11. The method of claim 7, further including anodizing a first surface of the mask with a tape disposed on a second surface of the mask.

12. The method of claim 7, further including aligning the mask to the semiconductor package by training a vision camera to recognize the mask.

13. A method of making a semiconductor device, comprising:

providing a semiconductor package;

disposing a mask including a fiducial marker over the semiconductor package, wherein the fiducial marker is formed on a top surface of the mask;

forming a shielding layer over the semiconductor package; and removing the mask.

14. The method of claim 13, wherein the mask includes a pair of fiducial markers positioned symmetrically.

15. The method of claim 13, further including a second fiducial marker formed in a cavity of the mask.

16. The method of claim 13, wherein the mask includes a two-dimensional barcode.

17. The method of claim 13, further including anodizing a first surface of the mask with a tape disposed on a second surface of the mask.

18. The method of claim 13, further including aligning the mask to the semiconductor package by training a vision camera to recognize the mask.

19. A method of making a semiconductor device, comprising:

providing a semiconductor package;

disposing a mask including a pair of fiducial markers positioned symmetrically over the semiconductor package; and forming a shielding layer over the semiconductor package and mask.

20. The method of claim 19, wherein the mask includes a two-dimensional barcode.

21. The method of claim 19, further including anodizing a first surface of the mask with a tape disposed on a second surface of the mask.

22. The method of claim 19, further including aligning the mask to the semiconductor package by training a vision camera to recognize the mask.

* * * * *